(12) United States Patent
Lee et al.

(10) Patent No.: US 11,215,648 B1
(45) Date of Patent: Jan. 4, 2022

(54) VOLTAGE ON-OFF DETECTOR AND ELECTRONIC DEVICE INCLUDING THE SAME

(71) Applicant: DB HiTek Co., Ltd., Seoul (KR)

(72) Inventors: Sang Mok Lee, Incheon (KR); Joon Tae Jang, Seoul (KR); Seung Hoo Kim, Bucheon-si (KR)

(73) Assignee: DB HiTek Co., Ltd., Seoul (KR)

( * ) Notice: Subject to any disclaimer, the term of this patent is extended or adjusted under 35 U.S.C. 154(b) by 0 days.

(21) Appl. No.: 17/007,744

(22) Filed: Aug. 31, 2020

(51) Int. Cl.
*G01R 19/15* (2006.01)
*G01R 19/155* (2006.01)

(52) U.S. Cl.
CPC .................................. *G01R 19/155* (2013.01)

(58) Field of Classification Search
None
See application file for complete search history.

(56) References Cited

U.S. PATENT DOCUMENTS

2014/0035623 A1* 2/2014 Hsiao ................... H03K 3/0231
327/54

* cited by examiner

*Primary Examiner* — Jas A Sanghera
(74) *Attorney, Agent, or Firm* — Andrew D. Fortney; Central California IP Group, P.C.

(57) ABSTRACT

A voltage on-off detector includes an inverter between a first voltage source and a third voltage source providing a third voltage and having an input terminal that receives a second voltage, a first transistor having a gate that receives the second voltage, and a first source and a first drain between the third voltage source and a first node, a second transistor having a second gate that receives the third voltage, and a second source and a second drain between a second voltage source providing the second voltage and the first node, and an amplifier configured to output a first voltage from the first voltage source or a voltage on the first node based on or in response to an output of the inverter.

20 Claims, 2 Drawing Sheets

VOLTAGE ON-OFF DETECTOR AND ELECTRONIC DEVICE INCLUDING THE SAME

BACKGROUND OF THE INVENTION

Field of the Invention

Embodiments of the present invention relate to a voltage on-off detector and an electronic device including the same.

Discussion of the Related Art

An input/output circuit of an electronic device may function as an electrical interface between one or more internal circuits on the electronic device and an external circuit outside of the electronic device. The input/output circuit of the electronic device may transmit or receive a voltage and/or signal from or to the internal circuit(s) and/or the external circuit.

In an electronic device employing multiple power levels, it is advantageous to consider a low-power design. For example, power consumption of the electronic device may be reduced by turning off power to an unused circuit or block in the electronic device to reduce static leakage in the unused circuit or block.

In an input/output circuit that receives a logic signal from an internal circuit on the electronic device and outputs the logic signal to an external circuit, when the driving power to the internal circuit is turned off, a control signal to a large driver in the input/output circuit may enter an unknown state, resulting in a relatively large leakage current and, in turn, an increase in power consumption (e.g., standby power consumption). As a result, reliability of the electronic device may be reduced, the lifetime thereof may decrease, and communication errors may occur between the electronic device and another electronic device (e.g., the external circuit).

SUMMARY OF THE INVENTION

Accordingly, the present invention is directed to a voltage on-off detector and an electronic device including the same that substantially obviate one or more problems due to limitations and disadvantages of the related art.

An object of embodiments of the present invention is to provide a voltage on-off detector that is capable of reducing power consumption (e.g., standby power consumption) and generating a reliable detection signal having a high response speed, and an electronic device including the same.

Additional advantages, objects, and features of the invention will be set forth in part in the description that follows and in part will become apparent to those skilled in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose(s) of the invention, as embodied and broadly described herein, a voltage on-off detector according to embodiments of the present invention includes an inverter between a first voltage source and a third voltage source providing a third (e.g., an input or low power) voltage, and having an input terminal that receives a second voltage, a first transistor having a first gate that receives the second voltage, and a first source and a first drain connected between the third voltage and a first node, a second transistor having a second gate that receives the third voltage, and a second source and a second drain between a second voltage source providing the second voltage signal and the first node, and an amplifier having an input terminal connected to an output terminal of the inverter and configured to output a first voltage or a voltage on the first node based on or in response to an output of the inverter.

The inverter may include a first NMOS transistor having a gate, a drain, and a source that receives the first voltage, and a first PMOS transistor having a gate connected to the gate of the first NMOS transistor, and a source and a drain between the drain of the first NMOS transistor and the third voltage source, wherein the gate of the first NMOS transistor and the gate of the first PMOS transistor may receive the second voltage.

The amplifier may include a second NMOS transistor having a gate, a drain, and a source that receives the first voltage, and a second PMOS transistor having a gate connected to the gate of the second NMOS transistor, a drain connected to the drain of the second NMOS transistor, and a source connected to the first node, wherein the input terminal of the amplifier may be connected to the gate of the second NMOS transistor and the gate of the second PMOS transistor.

The voltage on-off detector may further include a buffer configured to buffer the output of the amplifier and output a buffered detection signal.

The voltage on-off detector may further include a first CMOS inverter configured to output the first voltage or the voltage on the first node based on or in response to the output of the amplifier, and a second CMOS inverter configured to output the first voltage or the voltage at the first node based on or in response to the output of the first CMOS inverter.

Each of the first transistor and the second transistor may be or comprise a PMOS transistor.

The first voltage may be or comprise a ground potential.

The second voltage may be greater than the first voltage, and the third voltage may be less than the second voltage. The second voltage may be or comprise a peak second voltage, and the third voltage may be or comprise a peak third voltage.

Each of the first transistor and the second transistor may have or comprise a bulk connected to the first node.

A voltage on-off detector according to other embodiments of the present invention includes a first inverter between a first voltage source and a third voltage source providing a third voltage and having an input terminal that receives a second voltage, a first transistor having a first gate that receives the second voltage, and a first source and a first drain connected between the third voltage source and a first node, a second transistor having a second gate that receives the third voltage, and a second source and a second drain connected between a second voltage source providing the second voltage and the first node, an amplifier having an input terminal connected to an output terminal of the first inverter and configured to output a first voltage from the first voltage source or a voltage on the first node based on or in response to an output of the first inverter, a second inverter configured to output the first voltage or the voltage on the first node based on or in response to the output of the amplifier, and a third inverter configured to output a detection signal having the first voltage or the voltage on the first node based on or in response to the output of the second inverter.

The first voltage may be or comprise a ground potential, the third voltage may have a peak voltage greater than the first voltage, and the second voltage may have a peak voltage greater than the peak voltage of the third voltage.

An electronic device according to embodiments of the present invention includes an internal circuit configured to output data and a control signal, an input/output controller configured to perform one or more logic operations on the data, the control signal and a detection signal and generate a first logic signal and a second logic signal based on or in response to the logic operation(s), a driver including a PMOS transistor and an NMOS transistor and configured to perform a pull-down operation or a pull-up operation based on or in response to the first and second logic signals, an input/output terminal connected to the PMOS transistor and the NMOS transistor, and a voltage on-off detector configured to output the detection signal, wherein the voltage on-off detector is any one of the voltage on-off detector embodiments described herein.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Figure 1:
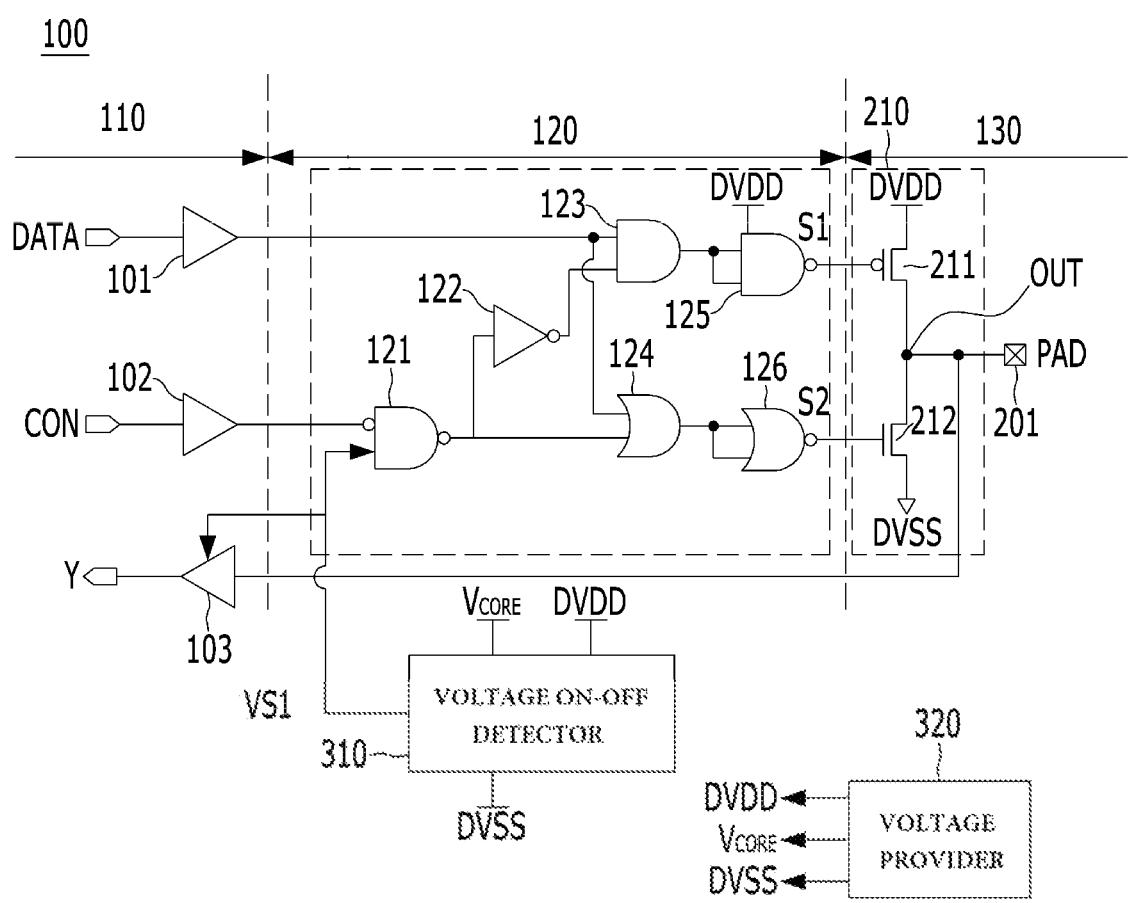
FIG. 1 is a view showing the configuration of an exemplary electronic device according to one or more embodiments of the present invention.

Reference will now be made in detail to embodiments of the present invention, examples of which are illustrated in the accompanying drawings.

In the following description of various embodiments, it will be understood that, when an element is referred to as being "on" or "under" another element, it can be directly on or under the other element, or it can be indirectly on or under the other element with one or more intervening elements therebetween. Furthermore, when the expression "on" or "under" is used herein, it may involve not only the upward direction, but also the downward and sideways directions, with reference to an element that is on or under another element.

In addition, it will be understood that relative terms used hereinafter, such as "first", "second", "on"/"above"/"over" and "under"/"below"/"beneath," may be construed only to distinguish one element from another element without necessarily requiring or involving a certain physical or logical relation or sequence between the elements. In addition, the same reference numerals will be used throughout the drawings to refer to the same or like parts.

FIG. 1 shows the configuration of an exemplary electronic device 100 according to one or more embodiments of the present invention.

Referring to FIG. 1, the electronic device 100 includes one or more internal circuits 110, an input/output controller 120, an input/output circuit 130, and a voltage on-off detector 310.

The electronic device 100 may further include a voltage provider 320 configured to provide voltages used in the internal circuit 110, the input/output controller 120, the input/output circuit 130, and the voltage on-off detector 310.

For example, the voltage provider 320 may be a voltage generator that provides a plurality of voltages (e.g., 2 or 3) that may be within different voltage ranges.

For example, the voltage provider 320 may include a first voltage source that provides a first voltage DVSS, a second voltage source that provides a second voltage DVDD, and a third voltage source that provides a third voltage $V_{CORE}$. That is, the voltage provider 320 may provide or generate the first voltage DVSS, the second voltage DVDD and the third voltage $V_{CORE}$.

Alternatively, for example, the voltage provider 320 may generate the third voltage $V_{CORE}$, the first voltage DVSS and the second voltage DVDD.

The first voltage DVSS may be, for example, 0V or a ground potential.

The on-state voltage of the second voltage DVDD may be a "second voltage". For example, the second voltage may be a peak voltage of the second voltage DVDD (e.g., a "peak second voltage"). The on-state voltage of the third voltage $V_{CORE}$ may be a "third voltage". For example, the third voltage may be a peak voltage of the third voltage $V_{CORE}$ (e.g., a "peak third voltage").

For example, the second voltage (for example, 3.3V or any other voltage in the range 2.0V to 5V) and the third voltage (for example, 1.2V or any other voltage in the range 0.8V to 1.8V) may be greater than the first voltage (for example, 0V or a ground potential), and the second voltage may be greater than the third voltage.

The internal circuit 110 provides data DATA and a control signal CON to the input/output controller 120.

For example, the internal circuit 110 may include a first amplifier or buffer 101 configured to amplify or buffer the data DATA and output (e.g., as a result of amplification or buffering) amplified or buffered data to the input/output controller 120, and a second amplifier or buffer 102 configured to amplify or buffer the control signal CON and output (e.g., as a result of amplification or buffering) an amplified or buffered control signal to the input/output controller 120.

For example, each of the first and second amplifiers or buffers 101 and 102 may be or comprise a buffer, an operational amplifier, a differential amplifier or an inverter, but is not limited thereto.

The internal circuit 110 may further include a third amplifier or buffer 103 configured to receive a signal Y from the input/output circuit 130 and amplify or buffer and output the same (e.g., to another circuit in the internal circuit 110).

For example, the third amplifier or buffer 103 may be or comprise a buffer, an operational amplifier, a differential amplifier or an inverter, but is not limited thereto.

The input/output controller 120 generates first and second logic signals S1 and S2 configured to control a driver 210 of or in the input/output circuit 130 based on and/or in response to the data DATA and the control signal CON from the internal circuit 110 and a detection signal VS1 from the voltage on-off detector 310.

For example, the input/output controller 120 may perform one or more logic operations on the received data DATA, the control signal CON and the detection signal VS2, and provide the first and second logic signals S1 and S2 (e.g., based on or in response to a result of the logic operation[s]) to the input/output circuit 130.

The input/output controller 120 may include a first logic gate 121, a first inverter 122, a second logic gate 123, a third logic gate 124, a fourth logic gate 125, and a fifth logic gate 126.

The first logic gate 121 performs a logic operation on the control signal CON and the detection signal VS1 from the voltage on-off detector 310 and outputs a first signal (e.g., based on the logic operation).

For example, the first logic gate 121 may be a NAND gate and may perform a NAND operation, but is not limited thereto. In an alternative example, an inverted control signal CON may be received by the first logic gate 121, but is not limited thereto. For example, an inverter (not shown) may be between an output terminal of the second amplifier or buffer 102 and one input terminal of the first logic gate 121.

The first inverter 122 inverts a first signal from the first logic gate 121 and outputs an inverted first signal.

The second logic gate 123 performs a logic operation on the data DATA and the inverted first signal output from the first inverter 122, and outputs a second signal (e.g., based on the logic operation performed by the second logic gate 123).

For example, the second logic gate 123 may be an AND gate and may perform an AND operation, but is not limited thereto.

The third logic gate 124 performs a logic operation on the data DATA and the first signal, and outputs a third signal (e.g., based on the logic operation performed by the third logic gate 124).

For example, the third logic gate 124 may be an OR gate and may perform an OR operation, but is not limited thereto.

The fourth logic gate 125 has first and second input terminals, and performs a logic operation on the second signal, which is input to each of the first and second input terminals of the fourth logic gate 125, and generates the first logic signal S1 (e.g., based on the logic operation performed by the fourth logic gate 125).

For example, the fourth logic gate 125 may be a NAND gate and may perform a NAND operation, but is not limited thereto.

The fifth logic gate 126 has third and fourth input terminals, and performs a logic operation on the third signal, which is input to each of the input terminals of the fifth logic gate 126, and generates the second logic signal S2 (e.g., based on the logic operation performed by the fifth logic gate 126).

For example, the fifth logic gate 126 may be a NOR gate and may perform a NOR operation, but is not limited thereto.

The input/output circuit 130 may include an input/output terminal 201 and the driver 210. The input/output terminal 201 may comprise a pad (e.g., PAD).

The driver 210 has an output node OUT, and outputs the first voltage (for example, 0V) DVSS or the second voltage (for example, 3.3V) DVDD at the output node OUT based on or in response to the first and second logic signals S1 and S2. The output node OUT is connected to the input/output terminal 201.

For example, the second voltage DVDD may be greater than the first voltage DVSS. In addition, for example, the third voltage $V_{CORE}$ may have or be within a voltage range that has a minimum value greater than the first voltage DVSS and a maximum value less than the second voltage DVDD.

The driver 210 may perform a pull-up or pull-down operation in response to the first and second logic signals S1 and S2 and output the second voltage, which is a pull-up voltage, or the first voltage, which is a pull-down voltage, on the output node OUT.

The driver 210 may include a PMOS transistor 211 and an NMOS transistor 212.

The PMOS transistor 211 may have a gate that receives the first logic signal S1, a source that receives the second voltage DVDD, and a drain connected to the input/output terminal 201.

The NMOS transistor 212 may have a gate that receives the second logic signal S2, a source that receives the first voltage DVSS, and a drain connected to a connection node of the input/output terminal 201 and the PMOS transistor 211.

The drain of the PMOS transistor 211 and the drain of the NMOS transistor 212 may be connected to the output node OUT.

The voltage on-off detector 310 detects whether the second voltage DVDD from the voltage provider 320 is on or off, and outputs the detection signal VS2 based on or in response to a result of the detection.

When the second voltage DVDD is "on," the second voltage DVDD is provided from the voltage provider 320 (for example, 3.3V), and when the second voltage DVDD is "off," the second voltage DVDD may float or be at a ground potential (for example, 0V).

For example, upon detecting that the second voltage DVDD from the voltage provider 320 is on and the third voltage $V_{CORE}$ is on, the voltage on-off detector 310 may output the detection signal VS2 having a first level (for example, a high binary logic level), and the electronic device 100 may perform input/output operations using the input/output terminal 201 based on or in response to the detection signal VS2 (which may be an input to one or more logic operations in the input/output controller 120).

Alternatively, upon detecting that the second voltage DVDD is off, the voltage on-off detector 310 may output the detection signal VS2 having a second level (for example, a low level binary logic), the driver 210 may be turned off by the input/output controller 120 (e.g., as a result of the logic operations[s]) based on or in response to the detection signal VS2 having the second level, and the input/output terminal 201 may enter a high impedance state. In addition, when the second voltage signal DVDD is off, the input path from the input/output terminal 201 may have a known state (e.g., enabled or inactive, which may respectively correspond to a high binary logic state or a low binary logic state), thereby making it possible to suppress or prevent leakage current.

Figure 2:
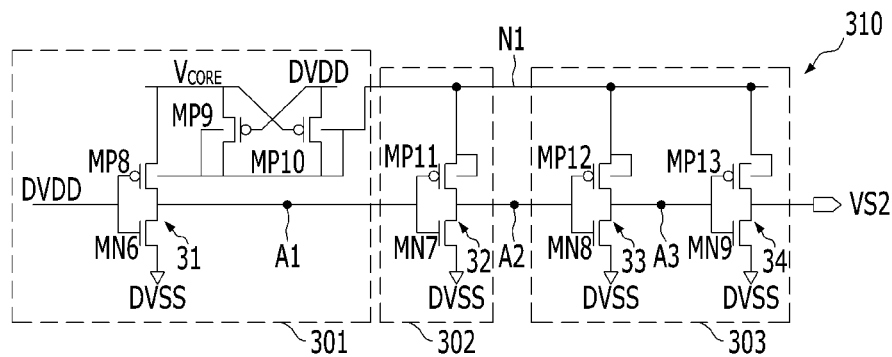
FIG. 2 is a circuit diagram of an embodiment of the voltage on-off detector in FIG. 1.
Figure 3:
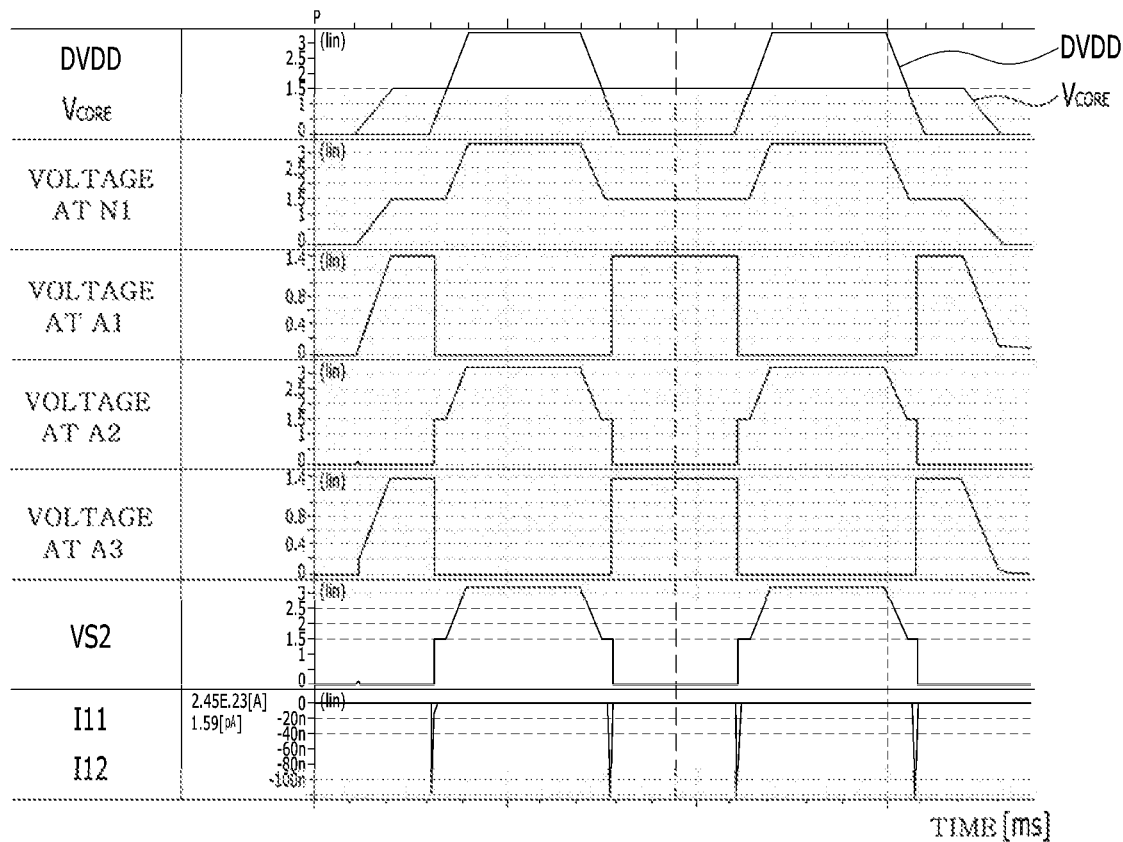
FIG. 3 is a waveform diagram illustrating simulation results of voltages at first to fourth nodes, a detection signal and current flow in the exemplary voltage on-off detector of FIG. 2.

FIG. 2 is a circuit diagram of an embodiment of the voltage on-off detector 310 in FIG. 1, and FIG. 3 is a waveform diagram illustrating the voltages at first to fourth nodes, a detection signal and the current flow in simulations of an exemplary voltage on-off detector (e.g., the exemplary voltage on-off detector 310 in FIG. 2).

The voltage on-off detector 310 may also be referred to as a "voltage detector" or a "power on-off detector".

Referring to FIG. 2, the voltage on-off detector 310 may detect whether the second voltage DVDD is on or off and output the detection signal VS2 based on or in response to a result of the detection.

The voltage on-off detector 310 may include a detection circuit 301, an amplification circuit 302, and a buffer 303.

The detection circuit 301 may include an inverter having a first PMOS transistor MP8 and a first NMOS transistor MN6, a first transistor MP9, and a second transistor MP10.

The inverter 31 may be or comprise a CMOS inverter, but is not limited thereto.

The inverter 31 may be between the first voltage source, which provides the first voltage DVSS, and the third voltage source, which provides the third voltage $V_{CORE}$, and have an input terminal that receives the second voltage DVDD.

The inverter 31 may output a signal having a voltage pulled down to the first voltage or pulled up to the third voltage based on or in response to the second voltage DVDD.

In the inverter 31, the first NMOS transistor MN6 may have a gate, a drain, and a source. The source of the first NMOS transistor MN6 receives the first voltage DVSS. The first PMOS transistor MP8 may have a gate connected to the gate of the first NMOS transistor MN6, and a source and a drain between the drain of the first NMOS transistor MN6 and the third voltage source.

The second voltage DVDD may be input to the gate of the first NMOS transistor MN6 and the gate of the first PMOS transistor MP8. For example, the third voltage signal $V_{CORE}$ may be provided to the source of the first PMOS transistor MP8.

The first transistor MP9 may have a first gate connected to the second voltage source, and a first source and a first drain between a first node N1 and the third voltage source. For example, the first source of the first transistor MP9 may be connected to the third voltage source, and the first drain of the first transistor MP9 may be connected to the first node N1.

Alternatively or additionally, the first gate of the first transistor MP9 may receive the second voltage DVDD, and the first source of the first transistor MP9 may receive the third voltage $V_{CORE}$. For example, the first transistor MP9 may be a PMOS transistor.

In addition, the first transistor MP9 may have a first bulk (or first body) or a first bulk node (or first body node) coupled or connected to the first node N1.

In addition, the first PMOS transistor MP8 of the inverter 31 may have a second bulk (or second body) or a second bulk node (or second body node) connected to the first node N1.

The second transistor MP10 may have a second gate connected to the third voltage source, a second source connected to the second voltage source, and a second drain connected to the first node N1. For example, the gate of the second transistor MP10 may receive the third voltage $V_{CORE}$, and the source of the second transistor MP10 may receive the second voltage DVDD. The second transistor MP10 may have a third bulk (or third body) or a third bulk node (or third body node) coupled or connected to the first node N1.

For example, the first node N1 may be a node at which the drain of the first transistor MP9 is connected to the drain of the second transistor MP10.

The amplification circuit 302 may amplify the output of the inverter 31.

For example, the amplification circuit 302 may output a voltage pulled up to the voltage on the first node N1 or pulled down to the first voltage (for example, 0V) DVSS based on or in response to the output of the inverter 31.

For example, the amplification circuit 302 may include an amplifier or inverter 32 having an input terminal connected to an output terminal of the inverter 31 and configured to output the voltage on the first node N1 or the first voltage DVSS based on or in response to the output of the inverter 31. Alternatively, at least one of the detection circuit 301 and the amplification circuit 302 may comprise a level shifter, configured to change a voltage of the input (e.g., DVDD) to a different voltage (e.g., $V_{CORE}$).

For example, the amplifier or inverter 32 may include a second NMOS transistor MN7 and a second PMOS transistor MP11.

For example, the second NMOS transistor MN7 may have a gate, a drain, and a source. The source of the second NMOS transistor MN2 receives the first voltage DVSS.

For example, the second PMOS transistor MP11 may have a gate connected to the gate of the second NMOS transistor MN7, and a source and a drain between the drain of the second NMOS transistor MN7 and the first node N1.

The second PMOS transistor MP11 may have a bulk (or body) or a bulk node (or body node) coupled or connected to the first node N1.

For example, the input terminal of the amplifier 32 may be connected to the gate of the second NMOS transistor MN7 and the gate of the second PMOS transistor MP11, and an output terminal of the amplifier or inverter 32 may be connected to the drain of the second NMOS transistor MN7 and the drain of the second PMOS transistor MP11.

The buffer 303 may buffer the output of the amplifier or inverter 32 and output an amplified or buffered voltage or signal. The output of the buffer 303 may be the detection signal VS2. In another embodiment, the buffer 303 may be omitted, and, in such a case, the output of the amplifier or inverter 32 may be the detection signal VS2.

The buffer 303 may include a first CMOS inverter 33 configured to output one of the first voltage DVSS and the voltage on the first node N1 based on or in response to the output of the amplifier 32, and a second CMOS inverter 34 configured to output one of the first voltage and the voltage on the first node N1 based on or in response to the output of the first CMOS inverter 33.

The first CMOS inverter 33 may include an NMOS transistor MN8 and a PMOS transistor MP12, and the second CMOS inverter 34 may include an NMOS transistor MN9 and a PMOS transistor MP13. The PMOS transistors MP12 and MP13 of the first and second CMOS inverters 33 and 34 may each have a bulk (or body) or a bulk node (or body node) coupled or connected to the first node N1.

For example, each of the first transistor MP9 and the second transistor MP10 may be a PMOS transistor, but is not limited thereto.

The first node N1 may be connected to the first PMOS transistor MP8 of the inverter 31, the first and second transistors MP9 and MP10, the second PMOS transistor MP11 of the amplifier 32, and the source of each of the PMOS transistors MP12 and MP13 of the buffer 303.

The operation of the voltage on-off detector 310 will hereinafter be described.

The first transistor MP9 and the second transistor MP10 may act as a comparator that compares the second voltage DVDD and the third voltage $V_{CORE}$, and outputs the greater of the two voltages to the first node N1 as a result of the comparison.

The voltage on the first node N1 may vary depending on the values of the second voltage DVDD and third voltage $V_{CORE}$.

For example, when the value of the second voltage DVDD is less than the value of the third voltage $V_{CORE}$, the voltage on the first node N1 may be the value of the third voltage $V_{CORE}$.

Alternatively, for example, when the value of the second voltage DVDD is greater than or equal to the value of the third voltage $V_{CORE}$, the voltage on the first node N1 may be the value of the second voltage DVDD.

A description will hereinafter be given of voltage variations on nodes A1, A2 and A3 and the detection signal VS2 in a first section in which the value of the second voltage DVDD rises from the first voltage (for example, 0V) to the second voltage (for example, 3.3V).

When the value of the second voltage DVDD is less than a threshold voltage of the NMOS transistor in the detection circuit 301 (for example, MN6), the transistor MN6 may not be on, and the voltages on the second and fourth nodes A1 and A3 may be the value of the third voltage $V_{CORE}$, the voltage on the third node A2 may be the first voltage DVSS, and the detection signal VS2 may have a low binary logic level (e.g., the first voltage DVSS). As the value of the second voltage DVDD rises (e.g., from 0 V or a ground potential to the threshold voltage of the NMOS transistor in the detection circuit 301), the detection signal VS2 stays in the low binary logic state (e.g., 0 V).

However, when the value of the second voltage DVDD is greater than or equal to the threshold voltage of the NMOS transistor in the detection circuit 301 (for example, MN6) but less than the value of the third voltage $V_{CORE}$, the first PMOS transistor MP8 of the inverter 31 may gradually turn off, and the first NMOS transistor MN6 of the inverter 31 may gradually turn on, so that the voltage at the second node A1 may fall from the third voltage $V_{CORE}$ to the first voltage DVSS, the voltage on the third node A2 may rise from the first voltage DVSS to the third voltage $V_{CORE}$ and stay at the third voltage $V_{CORE}$, the voltage on the fourth node A3 may fall from the third voltage $V_{CORE}$ to the first voltage DVSS, and the detection signal VS2 may increase from the first voltage DVSS to the third voltage $V_{CORE}$.

When the value of the second voltage DVDD is greater than or equal to the value of the third voltage $V_{CORE}$, the voltage on the second node A1 may be the first voltage DVSS, the voltage on the third node A2 may vary with the second voltage DVDD (e.g., it may increase as the second voltage DVDD increases), the voltage on the fourth node A3 may be the first voltage DVSS, and the detection signal VS2 may have a value equal to the second voltage. In other words, the detection signal VS2 may have a high binary logic level when the value of the second voltage DVDD is greater than the third voltage $V_{CORE}$.

Voltage variations on the nodes A1, A2 and A3 and the detection signal VS2 as the second voltage DVDD falls from its peak (for example, 3.3V) to the first voltage (for example, 0V, in the case of a power-down operation on the driver 210) may be in the reverse order of those as the second voltage DVDD rose from 0 V (or a ground potential) to its peak.

When the value of the second voltage DVDD is less than the threshold voltage of the NMOS transistor in the detection circuit 301 (for example, MN6), the voltage on-off detector 310 according to embodiments of the present invention may accurately output the detection signal VS2 having the first voltage (for example, 0V), thereby making it possible to secure reliability of the detection signal VS2.

Further, when the value of the second voltage DVDD is greater than or equal to the threshold voltage of the transistor MN6 and less than the third voltage $V_{CORE}$, the detection signal VS2 may rapidly rise to the third voltage $V_{CORE}$ (e.g., when the third voltage $V_{CORE}$ already has its peak value; see FIG. 3), so that the detection signal VS2 may have an improved response speed.

In addition, because the transition of the detection signal VS2 from the first voltage DVSS to the third voltage $V_{CORE}$ occurs when the value of the second voltage DVDD is greater than or equal to the threshold voltage of the transistor MN6 and less than the third voltage $V_{CORE}$, power consumption of the voltage on-off detector 310 may be reduced.

In addition, because the transition of the detection signal VS2 from the third voltage $V_{CORE}$ to the first voltage DVSS is made when the value of the second voltage DVDD is less than the threshold voltage of the transistor MN6, power consumption of the voltage on-off detector 310 may be reduced.

I11 in FIG. 3 represents the total current flow in the amplifier 32, the first CMOS inverter 33 and the second CMOS inverter 34, and I12 in FIG. 3 represents the total current flow in the inverter 31, the amplifier 32, the first CMOS inverter 33 and the second CMOS inverter 34. In FIG. 3, I11 may be approximately 2.45E23 A and I12 may be approximately 1.59 pA, so that power consumption of the voltage on-off detector 310 according to embodiments of the invention may be reduced.

Further, the voltage state detection by the voltage on-off detector 310 may be performed even when the values of the second voltage DVDD and the voltage of the third voltage $V_{CORE}$ are equal. In addition, according to the present embodiments, it may be possible to suppress or prevent generation of leakage current irrespective of the order of the on or off states of the second voltage DVDD and third voltage $V_{CORE}$.

As is apparent from the above description, according to various embodiments, it may be possible to reduce power consumption and generate a reliable voltage/power detection signal having a high response speed.

The embodiments as described above may include particular features, structures, or characteristics, but not every embodiment necessarily includes the particular features, structures, or characteristics. Furthermore, the particular features, structures or characteristics in each embodiment may be combined in any suitable manner, as would be apparent to one of ordinary skill in the art from this disclosure, in one or more embodiments. Therefore, combinations of features of different embodiments are meant to be within the scope of the invention.

What is claimed is:

1. A voltage on-off detector comprising:
   an inverter between a first voltage source and a third voltage source providing a third voltage, and having an input terminal that receives a second voltage;
   a first transistor having a first gate that receives the second voltage, and a first source and a first drain between the third voltage source and a first node;
   a second transistor having a second gate that receives the third voltage, and a second source and a second drain between a second voltage source providing the second voltage and the first node; and
   an amplifier having an input terminal connected to an output terminal of the inverter and configured to output a first voltage from the first voltage source or a voltage on the first node based on or in response to an output of the inverter.

2. The voltage on-off detector according to claim 1, wherein the inverter comprises:
   a first NMOS transistor having a gate, a drain, and a source that receives the first voltage; and a first PMOS transistor having a gate connected to the gate of the first NMOS transistor, and a source and a drain between the drain of the first NMOS transistor and the third voltage source, wherein the gate of the first NMOS transistor and the gate of the first PMOS transistor receive the second voltage.

3. The voltage on-off detector according to claim 2, wherein the amplifier comprises:

a second NMOS transistor having a gate, a drain, and a source that receives the first voltage; and a second PMOS transistor having a gate connected to the gate of the second NMOS transistor, a drain connected to the drain of the second NMOS transistor, and a source connected to the first node, wherein the input terminal of the amplifier is connected to the gate of the second NMOS transistor and the gate of the second PMOS transistor.

4. The voltage on-off detector according to claim 3, further comprising:

a first CMOS inverter configured to output the first voltage or the voltage on the first node based on or in response to the output of the amplifier; and a second CMOS inverter configured to output the first voltage or the voltage on the first node based on or in response to the output of the first CMOS inverter.

5. The voltage on-off detector according to claim 4, wherein the first voltage is a ground potential.

6. The voltage on-off detector according to claim 5, wherein the second voltage is greater than the first voltage, and the third voltage is less than the second voltage, wherein the second voltage comprises a peak second voltage, and the third voltage comprises a peak third voltage.

7. The voltage on-off detector according to claim 1, further comprising a buffer configured to buffer the output of the amplifier and output a buffered detection signal.

8. The voltage on-off detector according to claim 1, wherein each of the first transistor and the second transistor comprises a PMOS transistor.

9. The voltage on-off detector according to claim 8, wherein each of the first transistor and the second transistor comprises a bulk connected to the first node.

10. A voltage on-off detector comprising:

a first inverter between a first voltage source and a third voltage source providing a third voltage and having an input terminal that receives a second voltage signal;

a first transistor having a first gate that receives the second voltage, and a first source and a first drain between the third voltage source and a first node;

a second transistor having a second gate that receives the third voltage, and a second source and a second drain between a second voltage source providing the second voltage and the first node;

an amplifier having an input terminal connected to an output terminal of the first inverter and configured to output a first voltage from the first voltage source or a voltage on the first node based on or in response to an output of the first inverter;

a second inverter configured to output the first voltage or the voltage on the first node based on or in response to the output of the amplifier; and a third inverter configured to output a detection signal having the first voltage or the voltage on the first node based on or in response to the output of the second inverter.

11. The voltage on-off detector according to claim 10, wherein the first voltage is a ground potential, wherein the third voltage has a peak voltage greater than the first voltage, and the second voltage has a peak voltage greater than the peak voltage of the third voltage.

12. An electronic device comprising:

an internal circuit configured to output data and a control signal;

an input/output controller configured to perform one or more logic operations on the data, the control signal and a detection signal and generate a first logic signal and a second logic signal based on or in response to the one or more logic operations;

a driver comprising a PMOS transistor and an NMOS transistor and configured to perform a pull-down operation or a pull-up operation based on or in response to the first and second logic signals;

an input/output terminal connected to the PMOS transistor and the NMOS transistor; and a voltage on-off detector configured to output the detection signal, wherein the voltage on-off detector comprises:

an inverter between a first voltage source and a third voltage source providing a third voltage, and having an input terminal that receives a second voltage;

a first transistor having a first gate that receives the second voltage, and a first source and a first drain between the third voltage source and a first node;

a second transistor having a second gate that receives the third voltage signal, and a second source and a second drain between a second voltage source providing the second voltage and the first node; and an amplifier having an input terminal connected to an output terminal of the inverter and configured to output a first voltage from the first voltage source or a voltage on the first node based on or in response to an output of the inverter.

13. The electronic device according to claim 12, wherein the inverter comprises:

a first NMOS transistor having a gate, a drain, and a source that receives the first voltage; and a first PMOS transistor having a gate connected to the gate of the first NMOS transistor, and a source and a drain between the drain of the first NMOS transistor and the third voltage source, wherein the gate of the first NMOS transistor and the gate of the first PMOS transistor receive the second voltage.

14. The electronic device according to claim 13, wherein the amplifier comprises:

a second NMOS transistor having a gate, a drain, and a source that receives the first voltage; and a second PMOS transistor having a gate connected to the gate of the second NMOS transistor, a drain connected to the drain of the second NMOS transistor, and a source connected to the first node, wherein the input terminal of the amplifier is connected to the gate of the second NMOS transistor and the gate of the second PMOS transistor.

15. The electronic device according to claim 14, further comprising:

a first CMOS inverter configured to output the first voltage or the voltage on the first node based on or in response to the output of the amplifier; and a second CMOS inverter configured to output the first voltage or the voltage on the first node based on or in response to the output of the first CMOS inverter.

16. The electronic device according to claim 14, wherein the first voltage is a ground potential.

17. The electronic device according to claim 16, wherein the second voltage is greater than the first voltage, and the third voltage is less than the second voltage,
    wherein the second voltage comprises a peak second voltage, and the third voltage comprises a peak third voltage.

18. The electronic device according to claim 12, further comprising a buffer configured to buffer the output of the amplifier and output a buffered detection signal.

19. The electronic device according to claim 12, wherein each of the first transistor and the second transistor comprises a PMOS transistor.

20. The electronic device according to claim 19, wherein each of the first transistor and the second transistor comprises a bulk connected to the first node.

\* \* \* \* \*